(12) United States Patent
Pateux et al.

(10) Patent No.: US 9,287,894 B2
(45) Date of Patent: Mar. 15, 2016

(54) METHODS FOR ENCODING AND DECODING IMAGES, CORRESPONDING ENCODING AND DECODING DEVICES AND COMPUTER PROGRAMS

(75) Inventors: Stephane Pateux, Rennes (FR); Isabelle Amonou, Cesson-Sevigne (FR); Nathalie Cammas, Sens de Bretagne (FR)

(73) Assignee: ORANGE, Paris (FR)

( * ) Notice: Subject to any disclaimer, the term of this patent is extended or adjusted under 35 U.S.C. 154(b) by 998 days.

(21) Appl. No.: 13/500,583

(22) PCT Filed: Oct. 1, 2010

(86) PCT No.: PCT/FR2010/052081
§ 371 (c)(1),
(2), (4) Date: Jun. 13, 2012

(87) PCT Pub. No.: WO2011/042645
PCT Pub. Date: Apr. 14, 2011

(65) Prior Publication Data
US 2012/0263232 A1    Oct. 18, 2012

(30) Foreign Application Priority Data
Oct. 5, 2009    (FR) ..................................... 09 56932

(51) Int. Cl.
*H04N 19/91*    (2014.01)
*H03M 7/40*    (2006.01)
(Continued)

(52) U.S. Cl.
CPC ........... *H03M 7/4006* (2013.01); *H04N 19/196* (2014.11); *H04N 19/197* (2014.11); *H04N 19/436* (2014.11); *H04N 19/91* (2014.11)

(58) Field of Classification Search
CPC .... H04N 19/197; H04N 19/91; H04N 19/196
USPC ..................................................... 375/240.12
See application file for complete search history.

(56) References Cited

U.S. PATENT DOCUMENTS

2004/0258162 A1    12/2004    Gordon et al.
2007/0053437 A1    3/2007    Muller et al.
(Continued)

FOREIGN PATENT DOCUMENTS

| EP | 1355499 A2 | 10/2003 |
| FR | 2854754 A1 | 11/2004 |
| FR | 2931280 A1 | 11/2009 |

OTHER PUBLICATIONS

International Search Report dated Jan. 7, 2011 for corresponding International Application No. PCT/FR2010/052081, filed Oct. 1, 2010.
(Continued)

*Primary Examiner* — Tung Vo
*Assistant Examiner* — Rowina Cattungal
(74) *Attorney, Agent, or Firm* — David D. Bush; Westman, Champlin & Koehler, P.A.

(57) ABSTRACT

A method is provided for encoding an image represented by a sequence of symbols. The method includes the following steps: defining subsequences within the sequence; and going through the subsequences applying the following sub-steps for a routine subsequence: determining an adjacent routine encoded group including two previously encoded subsequences, one of which belongs to an adjacent encoded group associated with a subsequence that is separate from the routine subsequence; initializing a routine probability of occurrence of a symbol, taking into account two known probabilities of occurrence of the symbol, relating to two previously encoded subsequences of the adjacent routine encoded group; the consecutive entropic encoding of the symbols, and updating the routine probability of occurrence; and storing the routine probability of occurrence after encoding the last symbol.

16 Claims, 6 Drawing Sheets

(51) Int. Cl.
   *H04N 19/196*   (2014.01)
   *H04N 19/436*   (2014.01)

(56) References Cited

U.S. PATENT DOCUMENTS

| | | | |
|---|---|---|---|
| 2007/0223579 A1* | 9/2007 | Bao | 375/240.12 |
| 2007/0223580 A1* | 9/2007 | Ye et al. | 375/240.12 |
| 2008/0074426 A1 | 3/2008 | Stein et al. | |
| 2008/0219349 A1 | 9/2008 | Huang et al. | |
| 2008/0219578 A1* | 9/2008 | Lee | 382/247 |
| 2008/0310745 A1* | 12/2008 | Ye et al. | 382/238 |
| 2009/0168868 A1 | 7/2009 | Jahanghir | |
| 2010/0067582 A1 | 3/2010 | Muller et al. | |

OTHER PUBLICATIONS

French Search Report and Written Opinion dated Feb. 25, 2010 for corresponding French Application No. 0956932, filed Oct. 5, 2009.
English translation of the International Preliminary Report on Patentability and Written Opinion dated May 1, 2012, for corresponding International Application No. PCT/FR2010/052081, filed Oct. 1, 2010.
J. Rissanen et al. "Universal Modeling and Coding", IEEE Trans. Inform. Theory, vol. IT-27, pp. 12-23, Jan. 1981.

* cited by examiner

Figure 2b
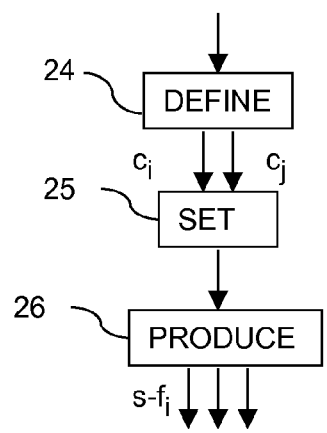
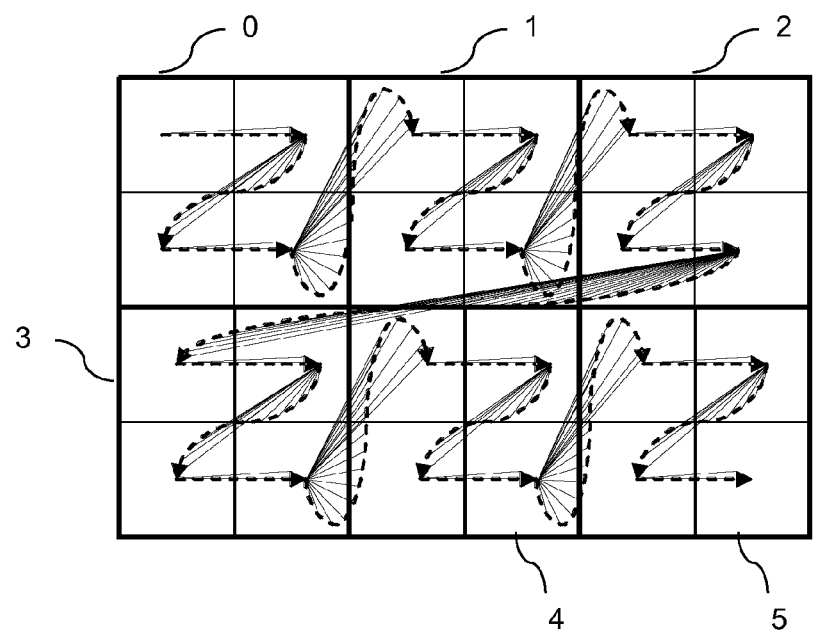
Figure 3

METHODS FOR ENCODING AND DECODING IMAGES, CORRESPONDING ENCODING AND DECODING DEVICES AND COMPUTER PROGRAMS

CROSS-REFERENCE TO RELATED APPLICATIONS

This Application is a Section 371 National Stage Application of International Application No. PCT/FR2010/052081, filed Oct. 1, 2010, which is incorporated by reference in its entirety and published as WO 2011/042645 on Apr. 14, 2011, not in English.

STATEMENT REGARDING FEDERALLY SPONSORED RESEARCH OR DEVELOPMENT

None.

THE NAMES OF PARTIES TO A JOINT RESEARCH AGREEMENT

None.

FIELD OF THE DISCLOSURE

The field of the disclosure is that of the encoding and decoding of images and especially of video streams constituted by a successive series of images.

The disclosure can thus apply in particular to video encoding implemented in present-day (MPEG, H.264 and other) video encoders or future (ITU-T/VCEG (H.265) or ISO/MPEG (HVC) video encoders.

BACKGROUND OF THE DISCLOSURE

Present-day video encoders (MPEG, H264, etc) use a blockwise representation of the video sequence. The images are subdivided into macro-blocks, and each macro-block is itself subdivided into blocks and each block or macro-block is encoded by intra-image or inter-image prediction. Thus, I images are encoded by spatial prediction (intra-prediction), P and B images are encoded by temporal prediction relatively to other I, P or B images encoded/decoded by means of motion compensation. Furthermore, for each block, there is encoded a residual block corresponding to the original block minus a prediction. The coefficients of this block are quantified after possible transformation and then encoded by an entropy encoder.

The emphasis here is more particularly on the entropy encoder. The entropy encoder encodes information in their order of arrival. Typically, a 1 raster-scan type of line-by-line scan of the blocks, as illustrated in FIG. 1, starting from the block at the top left of the image. For each block, the different pieces of information needed for the representation of the block (type of block, prediction mode, residue coefficients etc) are sent sequentially to the entropy encoder.

There is already a known arithmetic encoder that is efficient and is of reasonable complexity known as the CABAC ("Context Adaptive Binary Arithmetic Coder"), introduced in the AVC compression standard (also known as the ISO-MPEG4, part 10 and ITU-T H.264).

This entropy encoder implements different concepts:
arithmetic encoding: the encoder as first described in the document: J. Rissanen and G. G. Langdon Jr, "Universal modeling and coding", IEEE Trans. Inform. Theory, vol. IT-27, pp. 12-23, Jan. 1981, uses, to encode a symbol, a probability of appearance of this symbol;
the matching to the context: what is done here is to adapt the probability of appearance of the symbols to be encoded. On the one hand, on-the-fly learning is achieved. On the other hand, depending on the state of the preliminarily encoded information, a specific context is used for the encoding. Each context has a corresponding probability of appearance proper to the symbol. For example, a context corresponds to a type of encoded symbol (the representation of a coefficient of a residue, the signaling of an encoding mode, etc) and according to a given configuration, or a state of the neighborhood (for example the number of "intra" modes selected in the neighborhood, etc);
binarisation: symbols to be encoded are put into the form of a sequence of bits. Thereafter, these different bits are sent successively to the binary entropy encoder.

Thus, this entropy encoder, for each context used, implements a system of on-the-fly learning of the probabilities relatively to the symbols previously encoded for the context considered. This learning is based on the order of encoding of these symbols. Typically, the image is scanned in a "raster-scan" type of order as described here above.

Owing to the use of such a scanning order, this entropy encoder has several drawbacks.

Indeed, a lack of local matching of the learning of the probabilities can be seen, due to the type of scan. For example, during the encoding of a symbol situated at the beginning of a line, the probabilities used correspond chiefly to those observed for the symbols situated at the end of the previous line. Now, because of the possible spatial variation of the probabilities of the symbols (for example for a symbol related to a piece of motion information, the motion situated at the right-hand part of an image can be different from that observed on the left hand and, therefore, this can be the case also for the local probabilities that result therefrom), this lack of local matching of the probabilities leads to a loss in efficiency during the encoding.

To limit this phenomenon, proposals have been made to modify the order of scanning of the blocks in order to improve local consistency, but the encoding and the decoding remain sequential.

This is a second drawback of this type of entropy encoder. Indeed, since the encoding and decoding of a symbol depend on the state of the probability learned until then, the decoding of the symbols can be done only in the same order as that used during the encoding. Typically, the decoding therefore can only be sequential, thus preventing a parallel decoding of several symbols (for example to benefit from multicore architectures).

The patent document US2009168868A1, entitled "Systems and apparatuses for performing CABAC parallel encoding and decoding" describes a method enabling a type of parallelization of the encoding and/or of the decoding in a CABAC type encoder.

In a first embodiment described in this document, certain steps implemented in the encoder can be performed in parallel, for example the binarisation and the definition of the contexts, for a same syntax element or symbol. This embodiment does not enable a true parallelism of decoding of several symbols because the sequential decoding constraint remains present.

According to a second embodiment, an image is subdivided into slices, and the CABAC encoder is initialized at each start of a slice, in order to optimize the initialization of the probabilities. This embodiment enables a parallel decoding of the slices but the initialization of the decoder at each new slice greatly reduces the performance of the decoder. The lack of local matching of the probabilities is therefore further reinforced here.

There is therefore a need for a novel technique of entropy encoding of a sequence of symbols representing an image or a series of images making it possible especially to offer a non-sequential decoding of the encoded symbols without any loss of compression performance.

SUMMARY

An aspect of the disclosure relates to a method for encoding at least one image comprising a step for generating a sequence of symbols according to a predetermined encoding scan order.

According to an embodiment of the invention, such a method also comprises the following steps:

determining sub-sequences in each sequence, a sub-sequence comprising a predetermined grouping of symbols;

scanning determined sub-sequences comprising the following sub-steps for at least one current sub-sequence and for at least one context:

determining a neighboring group comprising a least two previously encoded sub-sequences, called a current encoded neighboring group, amongst which at least one belongs to an encoded neighboring group associated with a sub-sequence, distinct from said current sub-sequence, said distinct sub-sequence not belonging to said encoded neighboring group of the current sub-sequence, and said current sub-sequence not belonging to the encoded neighboring group of said distinct sub-sequence;

initializing at least one probability of appearance of a symbol associated with the context, called a current probability of appearance, taking account of at least two probabilities of appearance of said symbol, called known probabilities of appearance, relative to two previously encoded sub-sequences of said current encoded neighboring group;

successive entropy encoding of said symbols according to said predetermined encoding scan order and, for each symbol, updating of said current probability of appearance for the context associated with said symbol;

storage of said current probability of appearance of said encoded symbols in the current sub-sequence, after encoding of the last symbol of said current sub-sequence.

Thus, an embodiment of the invention relies on a novel and inventive approach to the encoding of images and more particularly to entropy encoding, enabling both a more efficient learning of the probabilities of appearance of the symbols for the encoding and a parallel decoding of the encoded symbols.

Indeed, an embodiment of the invention takes account, for the encoding of the symbols of the current sub-sequence, of a multidimensional neighborhood or encoded neighboring group comprising at least two previously encoded sub-sequences for a better local matching of the probabilities of appearance of the symbols and therefore of a more efficient learning of the probabilities.

Furthermore, an embodiment of the invention determines the neighborhoods of the sub-sequences to be encoded, so as to ensure the existence of at least two sub-sequences, the current sub-sequence and the as yet uncoded distinct sub-sequence, which are independent for the decoding and therefore capable of being decoded by decoders working in parallel.

An embodiment of the invention also proposes a pooling of a part of the neighborhood of these independent sub-sequences for the decoding so that the probabilities of appearance are propagated to one another and so as to obtain a sharing of the knowledge of the probabilities acquired as and when the encoding takes place.

Finally, an embodiment of the invention achieves a storage of the probabilities of appearance associated with each of the contexts used for the encoding of the symbols of the current sub-sequence at the end of its encoding so as to make it possible to take them into consideration during a subsequent encoding of another sub-sequence.

The storage of the probabilities related to the encoding of the symbols of a sub-sequence at the end of the encoding of this sub-sequence can be seen as a "point of synchronization" in the encoding, used subsequently for the decoding. Indeed, a "parallel" decoder could advantageously initialize the probabilities of appearance of the symbols of a sub-sequence to be decoded at two at least of these points of synchronization.

According to one particular aspect of the disclosure, the step for generating a sequence of symbols is obtained by means of a blockwise encoding and the predetermined grouping of the symbols is a grouping of blocks of fixed size, here below called a "super-block".

In this case, the points of synchronization correspond to the stored probabilities related to the context used for the encoding of the symbols of each encoded super-block of the image.

In particular, said current encoded neighboring group is situated in a rectangle demarcated on the one hand by the first encoded block of the image in the predetermined encoding scan order, and, on the other hand, by the grouping of blocks constituting the current sub-sequence. The rectangle is therefore chosen as a function of the predetermined encoding scan order.

It will be noted that the rectangle is well-suited to a line-type or column-type scanning for example, but non-exhaustively to the raster scan type of scanning.

The constraint on the choice of an encoded neighboring group situated in this rectangle makes it possible especially to reduce the time lag necessary between the decoding of non-dependent sub-sequences.

Indeed, as soon as the sub-sequences contained in the rectangle are decoded, the at least two mutually non-dependent sub-sequences situated at the boundary of the rectangle can be decoded simultaneously.

According to one particular embodiment of the invention, said at least two groupings of blocks constituting said at least two previously encoded sub-sequences of said current encoded neighboring group are adjacent to the grouping of blocks constituting the current sub-sequence.

Thus, the two groups of blocks, or super-blocks, determined in order to use the probabilities stored at the end of their encoding are situated in a neighborhood close to the current super-block, i.e. they contain blocks adjacent to at least one block of the current super-block so as to enable a better local matching of the probabilities of the symbols of the current super-block.

This characteristic also makes it possible not to take account of the encoding of super-blocks that have been previously encoded but are far too distant from the super-block considered, as is the case in the classic CABAC entropy encoder when considering a super-block at the start of a line for example, the encoding of which takes account of the previously encoded blocks situated at the end of the previous line.

According to one particular aspect of the disclosure, said step for initializing assigns said current probability of appearance a value equal to a combination of the known probabilities of appearance associated with at least two previously encoded sub-sequences of said current encoded neighboring group.

Thus, at the start of the encoding of a sub-sequence or a super-block, the probabilities of the symbols are initialized on the basis of the values of at least two previously obtained points of synchronization, i.e. on the basis of the probabilities stored during the previous encoding of at least two super-blocks. For example, for each symbol of the super-block, the probability of appearance of the symbol is initialized at a value equal to an average of the probabilities of appearance of this symbol stored at the end of the previous encoding of two super-blocks, situated in the encoded neighboring group of the super-block considered.

The advantage lies in the judicious re-utilization of the learning of the neighborhood: instead of only one default value or the value of a predefined neighbor, at least two neighboring values are taken, thus enabling better initialization and therefore more efficient encoding.

According to one particular embodiment of the invention, said combination takes account of the known probabilities of appearance associated with a first sub-sequence of said current encoded neighboring group situated to the left of said current sub-sequence and a second sub-sequence of said current encoded neighboring group situated above said current sub-sequence.

Thus, for a given super-block, we take account of the encoding of the two neighboring super-blocks situated respectively to the left and at the top of the given super-block. This choice of the two super-blocks constituting the encoded neighboring group of a super-block is particularly suited to a raster-scan type line-by-line scan of the super-blocks of the image. Indeed, the super-block situated at the top and the super-block situated to the left are already encoded and sufficiently close to the super-block considered for the probabilities of appearance of the symbols, stored at the end of their respective encoding, to be relevant to the encoding of the super-block considered.

If we consider a line-by-line scan of the super-blocks of the image, starting from the top of the image but going from right to left, then the choice of the super-blocks of the encoded neighboring group pertain on the contrary to the super-block situated respectively to the right and at the top of the super-block considered.

According to one particular aspect of the disclosure, the encoding method also comprises a step for determining a measure of confidence assigned to said current probability of appearance after the encoding of the last symbol of said current sub-sequence.

Thus, each probability of appearance of a symbol stored at the end of the encoding of a sub-sequence is assigned a measure of confidence making it possible to take account of the relevance of the probabilities obtained.

For example, when a symbol corresponds, for a current super-block, to a coefficient of residue (in the case of an inter-prediction) it can happen that the neighboring super-blocks do not have symbols of this type. The probability of appearance of this symbol in the current super-block, which was inherited from the sub-sequences of the encoded neighboring group, is then not very relevant to the neighboring super-blocks, and is therefore weighted by a fairly low measure of confidence.

In particular, said initialization step assigns said current probability of appearance a value equal to an average of the known probabilities of appearance associated with said sub-sequences of said current encoded neighboring group each weighted by a measure of confidence determined during said determining step.

Thus, when a probability of appearance of a symbol, denoted as first probability, for a sub-sequence of the encoded neighboring group is assigned a measure of confidence greater than that of the probability of appearance, denoted as a second probability, of this same symbol for another sub-sequence of the encoded neighboring group, then the current probability of appearance of this symbol in the current sub-sequence will be initialized at a value that takes greater account of the first probability than of the second probability.

According to another aspect of the disclosure, the encoding method comprises:
  a step for defining at least two classes of sub-sequences of symbols;
  a step for assigning a class, called a current class, to said current sub-sequence, this sub-sequence having, in its current encoded neighboring group, at least one previously encoded sub-sequence, denoted as a dependency sub-sequence, to which there is assigned a class distinct from said current class;
  a step for generating one sub-stream per class, each sub-stream bearing information representing the entropy encoding of the symbols of the sub-sequences belonging to said class.

Thus, it is possible to provide for the parallel decoding of the different sub-streams, while at the same time complying with a particular sequencing that takes account of the dependency sub-sequences.

Furthermore, it is ensured that knowledge is shared between the processes of decoding of the sub-streams, thus limiting the loss of performance generally associated with parallel decoding.

A signaling can be implemented when classes are defined for the sub-sequences. Thus, all the encoded symbols corresponding to the sub-sequences of a same class are grouped together in the predetermined encoding order. Then, the classes are put end-to-end in the stream in taking account of their dependency and are separated by end-of-class markers in the stream. It is these markers that will therefore be used during the decoding described here below.

Another aspect of the disclosure pertains to a method for decoding a stream representing at least one encoded image, comprising the following steps:
  obtaining at least one sub-sequence comprising a predetermined grouping of symbols;
and, for at least one sub-sequence thus obtained and for at least one context:
  initializing at least one probability of appearance of a symbol associated with said context, called a current probability of appearance, taking account of at least two probabilities of appearance of said symbol, called known probabilities of appearance, pertaining to two previously decoded sub-sequences of a current decoded neighboring group, a decoded neighboring group comprising at least two previously decoded sub-sequences, amongst which at least one belongs to a decoded neighboring group associated with a sub-sequence distinct from said current sub-sequence, said distinct sub-sequence not belonging to said encoded neighboring group of the current sub-sequence and said current sub-sequence not belonging to the encoded neighboring group of said distinct sub-sequence;

successive entropy decoding of said symbols according to an encoding scan order implemented during an encoding of said image and, for each symbol, updating of said current probability of appearance for the context associated with said symbol;

storage of said current probability of appearance of said decoded symbols in the current sub-sequence after decoding of the last symbol of said current sub-sequence.

Thus, an embodiment of the invention relies on a novel and inventive approach to image decoding and more particularly to entropy encoding, enabling both a more efficient learning of the probabilities of appearance of the symbols for the encoding and a parallel decoding of the encoded symbols.

This method of decoding could of course include the different characteristics pertaining to the encoding method according to an embodiment of the invention.

In particular, with a class being assigned to at least one sub-sequence of symbols during said encoding, said stream is formed by at least two sub-streams each associated with one of said classes, each sub-stream carrying information representing the entropy encoding of the symbols of the sub-sequences belonging to said class, and said steps of initialization, decoding and storage for sub-sequences belonging to a same class are implemented sub-stream by sub-stream, said sub-streams being parallel-processed, said steps of initialization, decoding and storage for at least one sub-sequence of dependency having been preliminarily implemented.

Thus, an embodiment of the invention in one embodiment, enables the parallel decoding of said certain sub-sequences by the parallel implementation of the different decoding steps described here above.

In particular, when classes have been assigned to the different sub-sequences during the encoding and when the stream has been formed in such a way that it includes sub-streams corresponding to the classes, then the decoding method can take account of these classes to decode the different sub-sequences in parallel. Thus, the different classes are used to define a certain sequencing for the decoding, i.e. constraints of scheduling of the sub-sequences to be decoded.

For example, the dependency sub-sequences that are assigned a class different from the class assigned to the current sub-sequence should have been decoded prior to the decoding of the current sub-sequence.

By contrast, all the mutually "independent" sub-sequences, i.e. the sub-sequences that do not appear in the decoded neighboring group of another, and that do have as yet non-decoded dependency sub-sequences can be decoded in parallel.

Another aspect of the disclosure pertains to a device for encoding at least one image represented by a sequence of symbols generated according to a predetermined encoding scan order.

According to an embodiment of the invention, such a device comprises:

means for determining sub-sequences in each sequence, a sub-sequence comprising a predetermined grouping of symbols;

means for scanning determined sub-sequences comprising, for at least one current sub-sequence and for at least one context:

means for determining a neighboring group comprising a least two previously encoded sub-sequences, called a current encoded neighboring group, amongst which at least one belongs to an encoded neighboring group associated with a sub-sequence, distinct from said current sub-sequence, said distinct sub-sequence not belonging to said encoded neighboring group of the current sub-sequence, and said current sub-sequence not belonging to the encoded neighboring group of said distinct sub-sequence;

means for initializing at least one probability of appearance of a symbol associated with said context, called a current probability of appearance, taking account of at least two probabilities of appearance of said symbol, called known probabilities of appearance, relative to two previously encoded sub-sequences of said current encoded neighboring group;

means for successive entropy encoding of said symbols according to said predetermined encoding scan order, and for each symbol, means for updating said current probability of appearance for the context associated with said symbol;

means for storing said current probability of appearance of said encoded symbols in the current sub-sequence, after encoding of the last symbol of said current sub-sequence.

Such an encoding device is especially suited to implementing the method for encoding described here above. It is for example an MPEG or H.264 encoder, or an encoder according to a future compression standard.

This encoding device could of course comprise the different characteristics of the method for encoding according to an embodiment of the invention.

Yet another aspect of the disclosure pertains to a device for decoding a stream representing at least one encoded image.

According to an embodiment of the invention, such a decoding device comprises:

means for obtaining at least one sub-sequence comprising a predetermined grouping of symbols;

and, for at least one sub-sequence thus obtained and for at least one context:

means for initializing at least one probability of appearance of a symbol associated with said context, called a current probability of appearance, taking account of at least two probabilities of appearance of said symbol, called known probabilities of appearance, pertaining to two previously decoded sub-sequences of a current decoded neighboring group, a decoded neighboring group comprising at least two previously decoded sub-sequences, amongst which at least one belongs to a decoded neighboring group associated with a sub-sequence distinct from said current sub-sequence, said distinct sub-sequence not belonging to said encoded neighboring group of the current sub-sequence and said current sub-sequence not belonging to the encoded neighboring group of said distinct sub-sequence;

means for successive entropy decoding of said symbols according to an encoding scan order implemented during an encoding of said image and, for each symbol, means for updating of said current probability of appearance for the context associated with said symbol;

means for storage of said current probability of appearance of said decoded symbols in the current sub-sequence after decoding of the last symbol of said current sub-sequence.

Such a decoding device is especially suited to implementing the method for encoding described here above. It is for example an MPEG or H.264 decoder, or a decoder according to a future compression standard.

This decoding device could of course comprise the different characteristics of the method for encoding according to an embodiment of the invention.

Another aspect of the disclosure pertains to a computer program comprising instructions to implement the method for encoding or decoding as described here above, when said program is executed by a processor.

It can be noted indeed, that the method for encoding or the method for decoding according to an embodiment of the invention can be implemented in a variety of ways, especially in hardwired form or in software form.

Another aspect of the disclosure also pertains to a transcoding device.

According to an embodiment of the invention, such a transcoding device comprises:
- an entropy decoding device capable of decoding the encoded symbols of a received sequence. This entropy decoding can be similar to that of an embodiment of the invention if the original sequence already contains sub-sequences or it may be classic if the original sequence does not contain them;
- an entropy encoding device according to an embodiment of the invention.

The entropy decoding is therefore followed by a step of entropy re-encoding of the symbols. The re-encoding is then similar to the encoding as described in an embodiment of the invention.

Such a transcoder makes it possible to define new sub-sequences from a sequence of encoded symbols as a function of the capacities of the terminal which has to perform the decoding. In particular, the decoder can adapt the complexity of decoding to the capacities of the terminal. For example, the transcoder defines eight or nine or N decoding classes depending on the capacities of the decoding terminal (for example, the number of processors which can work in parallel).

BRIEF DESCRIPTION OF THE DRAWINGS

Other features and advantages shall appear more clearly from the following description of a particular embodiment given by way of a simple, illustrative and non-exhaustive example and from the appended drawings, of which:

FIG. 2b presents other steps of the encoding method, according to this embodiment of the invention;

FIG. 3 shows an example of the partitioning of the image according to one embodiment of the invention;

FIGS. 5a, 5b and 5c present examples of a possible order of encoding/decoding according to one embodiment of the invention;

DETAILED DESCRIPTION OF ILLUSTRATIVE EMBODIMENTS

1. General Principle

The general principle of an embodiment of the invention relies on a "multi-dimensional" learning of the probabilities of appearance of the symbols, not dependent on the order of scanning of the image, and enabling a local matching of the probabilities of appearance of the symbols and a non-sequential decoding of the encoded symbols.

Thus, according to an embodiment of the invention, the learning of the probabilities of appearance of the symbols is based on a partitioning of the image into sub-sequences of symbols, for which the probabilities of appearance of the symbols are stored at the end of encoding and used to initialize probabilities of appearance of the symbols in a proximate neighborhood, whatever the order of scanning of the image for the encoding.

2. Description of Embodiments of the Encoding

Figure 1:
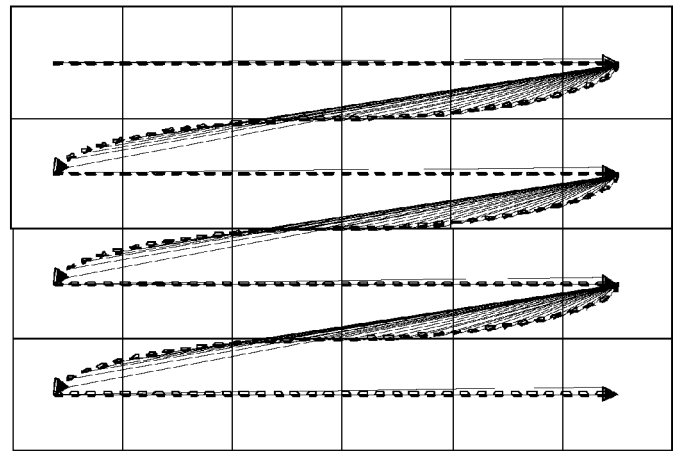
FIG. 1 already commented upon with reference to the prior art, presents an example of scanning of the blocks of an image of a raster scan type.
Figure 2A:
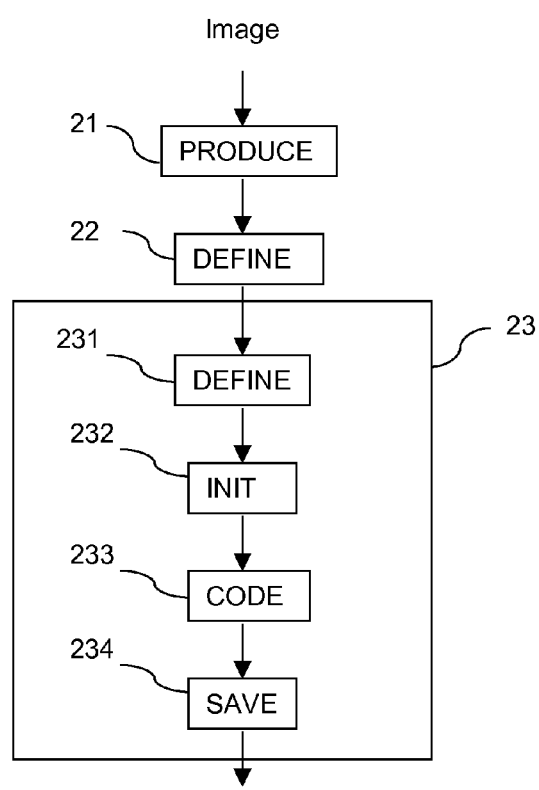
FIG. 2a presents the main steps of the encoding method according to an embodiment of the invention.

Referring now to FIG. 2, a description is given of the main steps of the encoding method according to one embodiment of the invention.

At a generation step 21, a sequence of symbols corresponding to the image to be decoded is generated in a predetermined scan order.

This generation step 21 can be implemented with the flow, i.e. the following steps 22, and 231 to 234 can be implemented in parallel with this step 21.

From this sequence of symbols onwards, sub-sequences of symbols are determined at a step of determination 22, each corresponding to a predetermined grouping of symbols.

This grouping can correspond for example to a grouping of blocks of the image, denoted as a super-block. Here below in the description, we consider a grouping of blocks comprising a fixed number of fixed-size blocks. It will be noted however that the invention is not limited to this example and could equally well apply to groupings of blocks comprising a variable number of variable-sized blocks.

Once these sub-sequences have been determined, they are scanned at a scanning step 23 comprising, for a current sub-sequence and for a context, the steps 231 to 234 described here below.

Again, in this embodiment, only one context is considered for the current sub-sequence, but the encoding method according to an embodiment of the invention can be implemented for several contexts.

The first step 231 consists in determining, for the current sub-sequence, a current encoded neighboring group comprising at least two previously encoded sub-sequences. Furthermore, among these sub-sequences, previously encoded and chosen to belong to the current encoded neighboring group, at least one belongs to another encoded neighboring group associated with another sub-sequence distinct from the current sub-sequence considered and not yet encoded.

In a second initializing step 232, for the current sub-sequence, the probability or probabilities of appearance, denoted as current probabilities of appearance, of a symbol associated with the context is or are initialized. Each current probability of appearance takes account of at least two known probabilities of appearance of the symbol, i.e. obtained during the previous encoding of at least two sub-sequences belonging to the current encoded neighboring group determined at the step 231.

The following encoding step 233 consists in carrying out a successive entropy encoding of the symbols of the sub-sequence, according to the predetermined scan order used at the step 21, and in updating the probability or probabilities of appearance associated with each symbol.

Finally, once all the symbols of the sub-sequence have been thus encoded, the probability or probabilities of appearance are stored, at a storage step 234, with a view to their use for the encoding of other neighboring sub-sequences during the following iterations of the step 23.

It will be noted that the encoding can be done with the flow, i.e. that the steps described here above can run in parallel.

FIG. 3 illustrates an example of the scanning of the image for an entropy encoding according to this embodiment of the invention, in which a sub-sequence corresponds to a super-block comprising four blocks.

FIG. 3 shows six super-blocks numbered zero to five, in raster-scan type of line-by-line order of scanning of the super-blocks.

During the encoding of a super-block, the probabilities of appearance associated with the super-block situated to the left as well as those associated with the super-block situated above are therefore available. These two super-blocks are therefore deemed to constitute the current encoded neighboring group for a current super-block considered.

For example, if we consider the super-block 4 of FIG. 3 to be the current super-block, then the super-blocks 1 and 3 constitute the current encoded neighboring group. It can be seen that the super-block 1 can also form part of a neighboring group encoded for the super-block.

If we consider an order of scanning of the super-blocks different from a raster-scan type of scanning, for example a right-to-left line-by-line scan, starting from the top right corner of the image, it is then possible, for the current super-block 4, to choose an encoded neighboring block comprising the super-blocks 1 and 5.

In generalizing this point, for a current super-block (i,j) (i.e. the $j^{th}$ super-block situated on the $i^{th}$ line of the super-blocks), the initialization step defines the value of the probability of appearance of initialization $P_{SB,init}(i,j)$ as follows:

$P_{SB,init}(i,j)$=Averaging ($P_{SB,stored}(i, j-1)$; $P_{SB,stored}(i-1; j)$), with $P_{SB,stored}$ (i, j-1) and $P_{SB,stored}$ (i-1; j) respectively the values of the probabilities of appearance stored at the end of the encoding of the super-blocks (i, j-1) and (i-1; j).

The probability of appearance of initialization $P_{SB,init}(i,j)$ corresponds to a combination obtained from the stored probabilities $P_{SB,stored}$ for the super-blocks of the current encoded neighboring group.

According to a first variant, $P_{SB,init}(i,j)$ is equal to the average of these two probabilities, that is: $P_{SB,init}(i,j)$=$(P_{SB,stored}(i, j-1)+P_{SB,stored}(i, j-1))/2$.

According to another variant, each stored probability of appearance is assigned a measure of confidence denoted as $N_{SB,post}(.;.)$. It is then possible to initialize $P_{SB,init}(i,j)$ with a value equal to an average of the two probabilities stored at the end of the encoding of the super-blocks (i, j-1) and (i-1; j), each weighted by a measure of confidence, that is:

$P_{SB,init}(i,j)=(N_{SB,stored}(i, j-1) \cdot P_{SB,stored}(i, j-1)+$
$N_{SB,stored}(i-1, j) \cdot P_{SB,stored}(i-1; j))/$
$(N_{SB,stored}(i, j-1)+N_{SB,stored}(i-1, j))$.

Should the left super-block be not present, then the values of the super-block above are used directly, and should the super-block below be not available, then the values of the super-block to the left are used directly.

Should there be no super-block, neither to the left nor above, then a default value is initialized, for example the value of probability of initialization classically used by the CABAC encoder.

According to one alternative embodiment, it is also possible to define a measure of confidence $N_{SB,init}$ for the probability obtained. This measure of confidence is established by a method of combinations similar to the one described here above for $P_{SB,init}$ on the basis of the values $N_{SB,post}$ for the super-blocks of the encoded neighboring group.

Appendix A, which forms an integral part of the present description, presents an implementation of lower complexity of the computation of the weighted average for the initialization of the probability of appearance of a symbol.

Once the probability of appearance of the symbol has been initialized, then the blocks of the current super-block are scanned, for example in a raster-scan type of order as illustrated in FIG. 3.

The probability p of encoding is initialized at the preliminarily defined value $P_{SB,init}(i,j)$ and develops in a classic way by the formula:

$$p(b=0) = \alpha \cdot p(b=0) + \begin{cases} (1-\alpha) & \text{if the encoded bit is 0} \\ 0 & \text{else} \end{cases}$$

At the end of the encoding of all the blocks of the super-block, the state of the value of probability of appearance is then stored in $P_{SB,stored}(i, j)$.

As indicated here above, a measure of confidence can be assigned to this probability, for example as follows:

$N_{SB,stockée}(i, j)=\alpha' \cdot N_{SB,init}(i, j)+(1+\alpha') \cdot N_{SB}(i, j)$, where $\alpha'$ corresponds to the updating attenuation factor, or a parameter of control of the learning speed similar to $\alpha$ used for the updating of the probability of a classic CABAC type arithmetic encoder $$\left(\alpha = \sqrt[63]{\frac{0.01875}{0.5}} \approx 0.95\right)$$

and $N_{SB}$ corresponds to the number of symbols encoded for the super-block considered.

Referring now to FIG. 2b, we present other steps of the encoding method according to this embodiment of the invention enabling especially a parallel decoding of certain sub-sequences.

Thus, according to this embodiment of the invention, the encoding method considers classes associated with sub-sequences, enabling parallel encoding/decoding in parallel in several processors, in complying with the constraints of scheduling on the processing of different super-blocks within these processors.

At a first stage, at a definition step 24, at least two classes $c_i$ and $c_j$ of sub-sequences are defined for the sub-sequences defined preliminarily during the step 22.

Then, at an assigning step 25, a class is assigned to the current sub-sequence, it being known that this sub-sequence has, in its current encoded neighboring group, at least one previously encoded sub-sequence, denoted as a dependency sub-sequence, to which a class distinct from said current class is assigned.

Thus, when encoding, a dependency which will be used during the decoding, is marked here between certain sub-sequences by the assignment of a class.

Finally, one sub-stream $s-f_i$ per class is generated at a generation step 26, each sub-stream carrying information representing the entropy encoding of the symbols of the sub-sequences belonging to said class.

In this way, the sub-sequences that do not have dependency can be decoded in parallel, and the decoding of the sub-sequences having a dependency has to be done in complying with this dependency constraint.

In particular, the sub-streams can be generated by a transcoder which, on the basis of a binary stream representing a sequence of encoded symbols for an image, makes it possible to generate several binary sub-streams decodable in parallel as described in an embodiment of the invention.

The original sequence of encoded symbols may or may not contain parallel-decodable sub-sequences, i.e. it may have been generated from an encoder such as that of an embodiment of the invention or else by a classic encoder.

One aim of the transcoder is to define new sub-sequences as a function of the capacities of the terminal which have to perform the decoding. This therefore makes it possible to adapt the decoding complexity to the capacities of the terminal. For example, the transcoder could thus define four, eight or x decoding classes according to the capacities of the decoding terminal.

Figure 8:
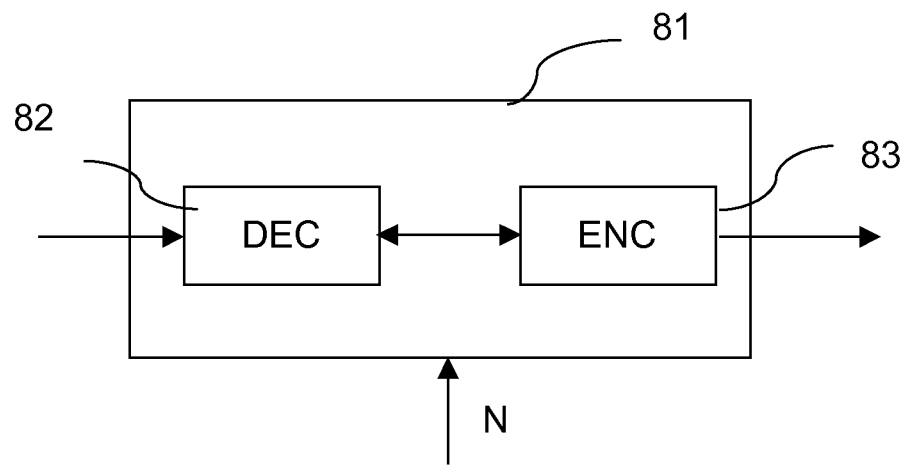
FIG. 8 presents the structure of a transcoding device according to one embodiment of the invention.

One example of a transcoding device 81 according to an embodiment of the invention shall now be described with reference to FIG. 8. It comprises an entropy decoding device 82 and an encoding device 83 according to an embodiment of the invention. Upon reception of a first sequence of encoded symbols representing one or more images, the entropy encoding device provides a sequence of decoded symbols, which is transmitted to the encoding device according to an embodiment of the invention for re-encoding in a second sequence of encoded symbols. The entropy decoding is similar to that of an embodiment of the invention if the original sequence contains sub-sequences or to a classic decoding if the original sequence contains none of them. The entropy re-encoding for its part is similar to the encoding as described in an embodiment of the invention.

According to one aspect, the transcoding device 81 is capable of defining classes as the function of a priori knowledge of the capacities of the destination terminal of the second sequence of encoded symbols, for example in terms of numbers of processors available. In this case, the transcoding device according to an embodiment of the invention provides as many binary sub-streams as there are previously defined classes.

Figures 5A, 5B:
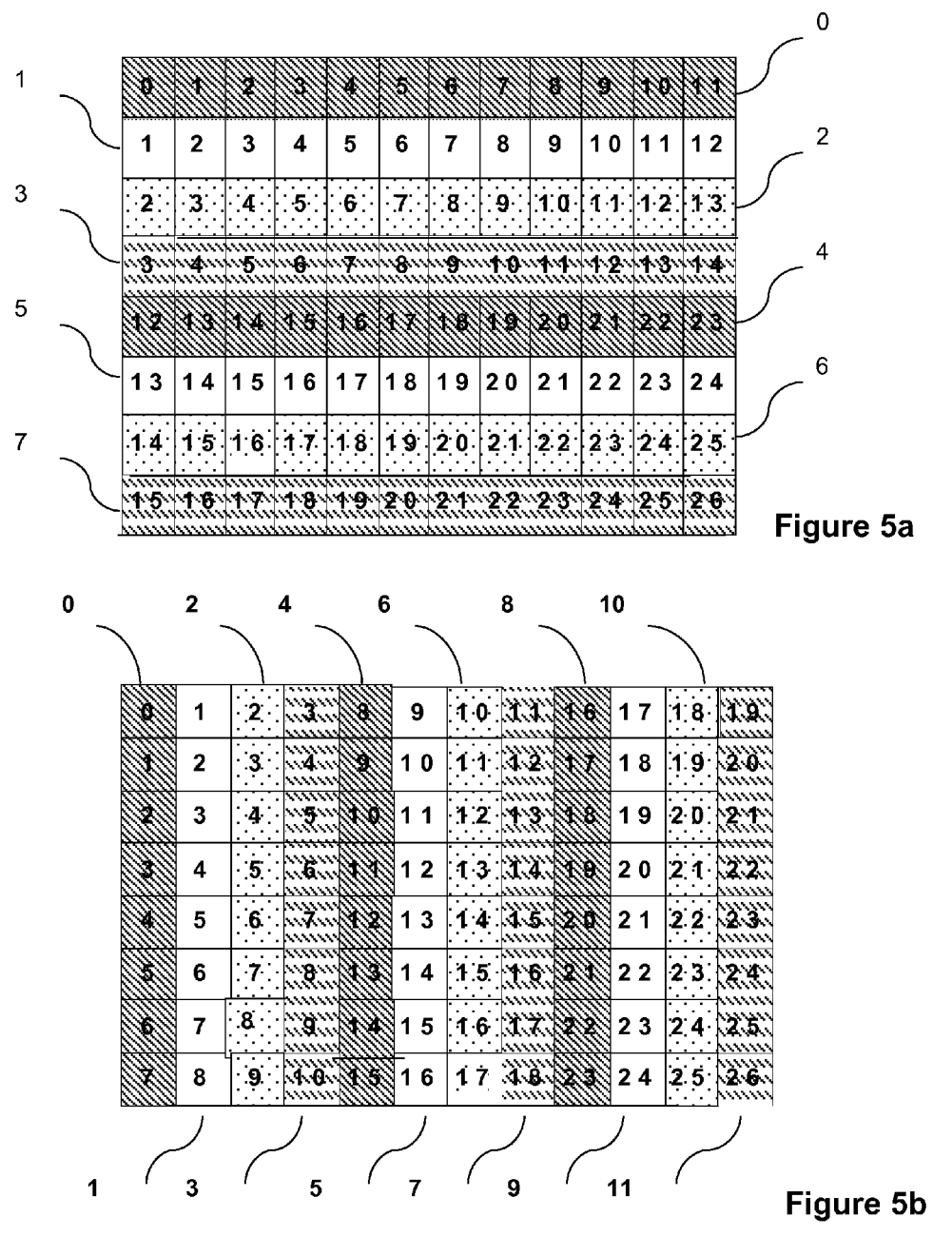
Figure 5C:
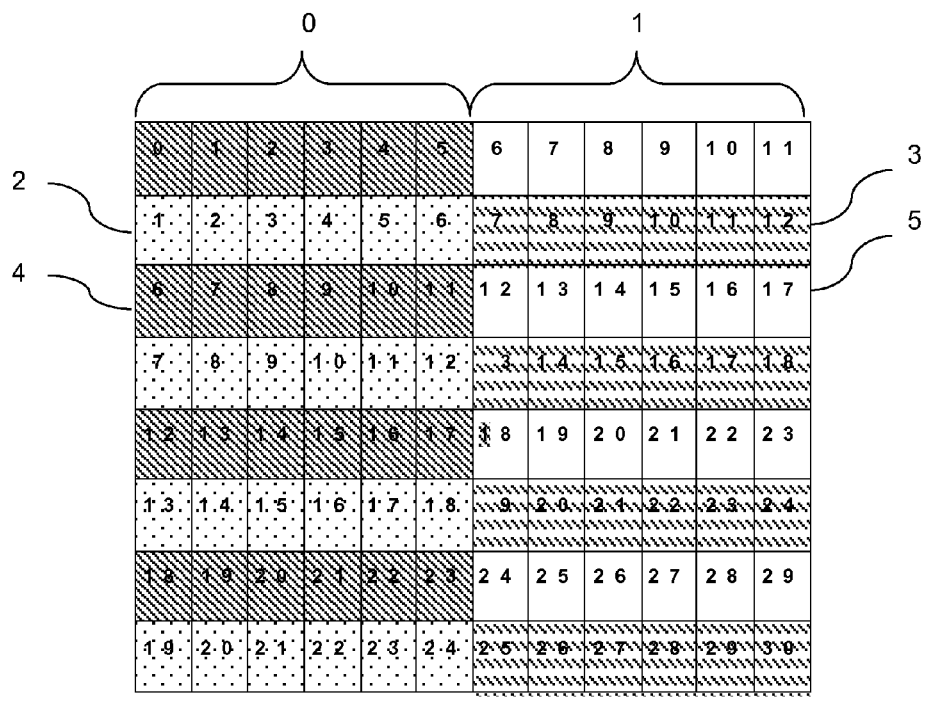

FIGS. 5a to 5c illustrate three examples of assignment of classes to sub-sequences, when a sub-sequence corresponds to a super-block (a super-block is represented by a numbered square).

They shall be described in greater detail here below.

3. Description of Embodiments of the Decoding

Figure 4A:
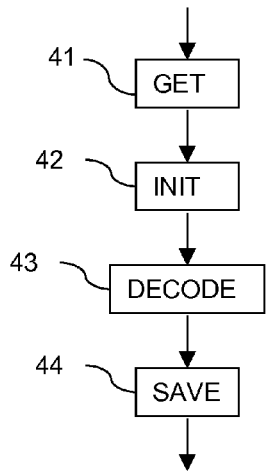
FIG. 4a shows the main steps of the encoding method according to one embodiment of the invention.
Figure 4B:
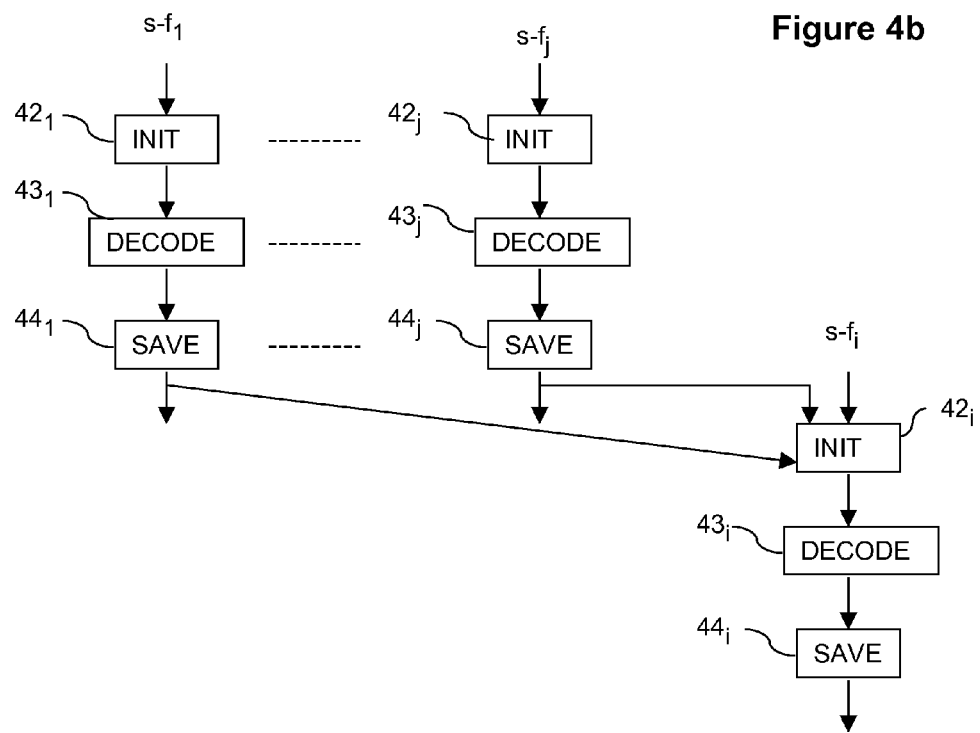
FIG. 4b presents the other steps of the encoding method, according to this embodiment of the invention.

Referring now to FIGS. 4a and 4b, we therefore present the method of decoding according to the embodiments of the invention.

In a first step 41, a sub-sequence is obtained comprising a predetermined grouping of symbols to be decoded, denoted as a current sub-sequence.

Then, at an initialization step 42, an initialization is done on the probability or probabilities of appearance, denoted as current probabilities of appearance, of a symbol of the sub-sequence associated with the context. Each current probability of appearance takes account of at least two known probabilities of appearance of the symbol, i.e. probabilities obtained during the previous decoding of at least two sub-sequences belonging to a neighborhood of the current sub-sequence.

This neighborhood is called a current decoded neighboring group and comprises at least two previously decoded sub-sequences, including at least one belonging to a decoded neighboring group associated with a distinct sub-sequence of the current sub-sequence. Thus, a sub-sequence may be used for decoding several other sub-sequences.

The following decoding step 43 consists in carrying out a successive entropy decoding of the symbols of the sub-sequence, in a scan order implemented during an encoding of the image and updating the probability or probabilities of appearance associated with each symbol.

Finally, once all the symbols of the sub-sequence have been thus decoded, the probability or probabilities of appearance are stored, at a storage step 44, with a view to their use for the decoding of other neighboring sub-sequences, during the iterations of the step 42 to 44.

Referring now to FIGS. 4b, and 5a to 5c, we describe other steps of the decoding method according to this embodiment of the invention.

FIG. 4b presents an example of parallel decoding according to one embodiment of the invention.

According to this embodiment, a class has been assigned to at least one sub-sequence of symbols during the encoding and the stream to be decoded is formed by at least two sub-streams each associated with a class. Each sub-stream carries information representing the entropy encoding of the symbols of the sub-sequences belonging to the class, the encoding being done according to the encoding method of an embodiment of the invention described here above.

The steps 42, 43 and 44 described here above can then be implemented sub-stream by sub-stream.

As illustrated in FIG. 4b, the sub-streams $s-f_1$ to $s-f_j$ can thus be processed in parallel, once the sub-sequences of dependencies as described here above have already been decoded.

FIG. 4b also illustrates an example of dependency between several sub-streams. Thus, the sub-stream $s-f_i$ is processed only once the processing of the two sub-streams $s-f_1$ and $s-f_j$ is terminated, because the initialization step $42_i$ takes account of the probabilities stored respectively at the steps $44_1$ and $44_j$. This is the case when the sub-sequence corresponding to the sub-stream $s-f_i$ has a current decoded neighboring group comprising the two sub-sequences corresponding to the two sub-sequences $-f_1$ and $s-f_j$.

FIGS. 5a to 5c particularly illustrate three examples of possible order of decoding the sub-sequences, corresponding to super-blocks in this embodiment.

FIG. 5a illustrates an example of an embodiment in which the same class is assigned to all the sub-sequences of a same line of the image, for example the class numbered 0 corresponds to the first line at the top of the image, the class 1 corresponds to the second line, etc.

Thus, the super-blocks numbered 0 to 11 on the line 0 are all assigned to the same class 0 and form a sub-stream 0, and the same is the case for all the super-blocks of the line 4. According to this embodiment, a super-block, in order to be decoded, is deemed to use the probabilities stored during the decoding of two neighboring super-blocks, those situated respectively above and to the left. Thus, the super-blocks of the line 0 must be decoded sequentially, the block situated to the left having to be decoded preliminarily to the decoding of the current block.

By contrast, if we consider the line 1, it can be seen that, once the blocks 0 and 1 of the line 0 are decoded, the blocks of the line 1 can also be decoded. Indeed, the block 2 of the line 1 needs the blocks 1 of the line 0 and 1 decoded and so on and so forth.

According to this embodiment, the different lines can therefore be decoded in parallel in complying with the constraint of dependency, i.e. in beginning the decoding of the line 0 before the decoding of the line 1 and so on and so forth.

From a temporal viewpoint, if we consider that the block numbers correspond to the instant at which they are decoded, then it can be seen that at the instant t=4 for example, the blocks 4 of the lines 0, 1, 2 and 3 can be decoded.

In FIG. 5*b*, a class is assigned to the super-blocks of a same column and the sub-stream therefore corresponds to a column. The principle is the same as the one described with reference to FIG. 5*a*, with columns.

These two examples of embodiments show that the 96 super-blocks of the image can be decoded into 27 instants instead of 96 instants for a classic decoding.

In FIG. 5*c*, one class is assigned to one half line and makes it possible to decode 96 blocks of the image in 31 instants.

4. Structure of the Encoding and Decoding Devices

Figure 6:
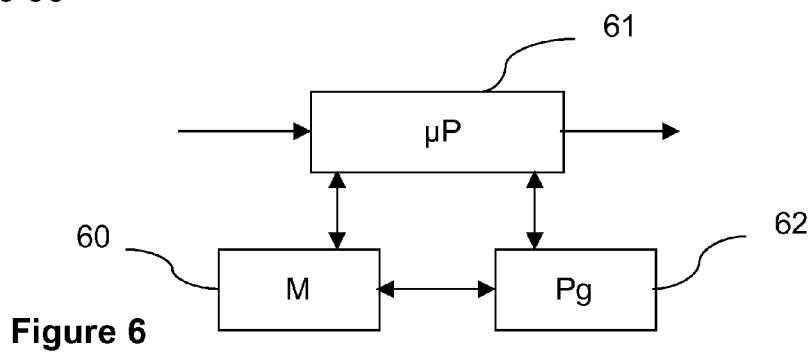
FIGS. 6 and 7 respectively present the structure of an encoding device and a decoding device according to one particular embodiment of the invention.
Figure 7:
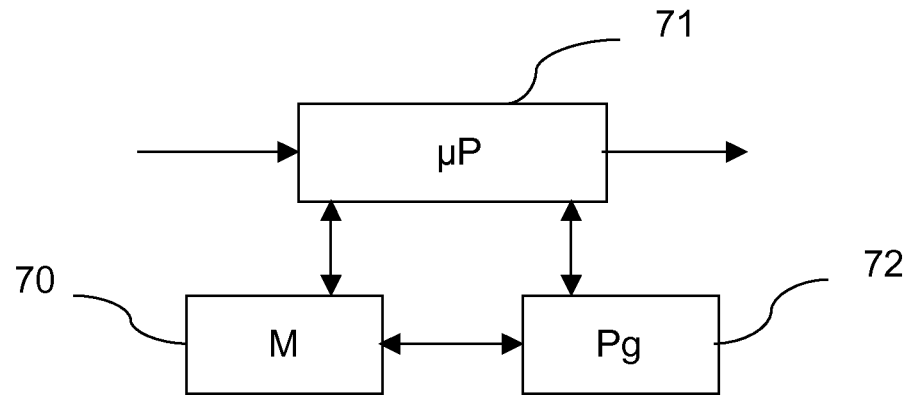

Finally, referring to FIGS. 6 and 7, we present the simplified structures of an encoding and a decoding device according to the embodiments described here above.

As illustrated in FIG. 6, an encoding device comprises a memory 61 comprising a buffer memory, a processing unit 62 equipped for example with a microprocessor µP and driven by the computer program 63, implementing the encoding method according to an embodiment of the invention.

At initialization, the code instructions of the computer program 63 are for example loaded into a RAM and then executed by the processor of the processing unit 62. The processing unit 62 inputs an image represented by a sub-sequence of symbols. The microprocessor of the processing unit 62 implements the steps of the encoding method described here above according to the instructions of the computer program 63. To this end, the encoding device comprises, in addition to the buffer memory 60, means for determining sub-sequences in said sequence, a sub-sequence comprising a predetermined grouping of symbols, means for scanning determined sub-sequences, comprising for at least one current sub-sequence and for at least one context, means for determining a neighboring group comprising at least two previously encoded sub-sequences, called a current encoded neighboring group, amongst which at least one belongs to an encoded neighboring group associated with a sub-sequence distinct from said current sub-sequence, said distinct sub-sequence not belonging to said encoded neighboring group of the current sub-sequence and said current sub-sequence not belonging to the encoded neighboring group of said distinct sub-sequence, means for initializing at least one probability of appearance of a symbol associated with said context, called a current probability of appearance, taking account of at least two probabilities of appearance, of said symbol, called known probabilities of appearance, relative to two previously encoded sub-sequences of said current encoded neighboring group, means for successive entropy encoding of said symbols according to said predetermined encoding scan order, and for each symbol, means for updating said current probability of appearance for the context associated with said symbol, and means for storing said current probability of appearance of said symbols encoded in the current sub-sequence, after encoding of the last symbol of said current sub-sequence. These means are driven by the microprocessor of the processing unit 62. The processing unit 62 therefore transmits a stream representing at least one encoded image to at least one decoding device.

As illustrated in FIG. 7, such a decoding device for its part comprises a memory 70 comprising a buffer memory, a processing unit 72 equipped for example with a microprocessor µP and driven by the computer program 73 implementing the decoding method according an embodiment of the invention.

At initialization, the code instructions of the computer program 73 are for example loaded into a RAM and then executed by the processor of the processing unit 72. The processing unit 72 inputs a stream representing at least one encoded image. The microprocessor of the processing unit 72 implements the steps of the decoding method described here above according to the instructions of the computer program 73. To this end, the decoding device comprises, in addition to the buffer memory 71, means for obtaining at least one sub-sequence comprising a predetermined grouping of symbols and, and, for at least one sub-sequence thus obtained and for at least one context, means for initializing at least one probability of appearance of a symbol associated with said context, called a current probability of appearance, taking account of at least two probabilities of appearance of said symbol, called known probabilities of appearance, pertaining to two previously decoded sub-sequences of a current decoded neighboring group, a decoded neighboring group comprising at least two previously decoded sub-sequences, amongst which at least one belongs to a decoded neighboring group associated with a sub-sequence distinct from said current sub-sequence, means for successive entropy decoding of said symbols according to an encoding scan order implemented during an encoding of said image and, for each symbol, means for updating of said current probability of appearance for the context associated with said symbol, and means for storage of said current probability of appearance of said decoded symbols in the current sub-sequence after decoding of the last symbol of said current sub-sequence These means are driven by the microprocessor of the processing unit 72.

APPENDIX A

If ($N_{SB,stored}$(i, j−1)>0)
then W0 = $\log_2$($N_{SB,stored}$(i, j−1)); // possible tabulation
else W0 = Tmin;
If (W0 > Tmax) then W0=Tmax
If ($N_{SB,stored}$(i−1,j)>0)
then W1 = log2($N_{SB,stored}$(i−1, j)); // possible tabulation
else W1 = Tmin;
If (W1 > Tmax) then W1=Tmax;
K = W0−W1;
If (K>0) then
    Si (K>16) then K=16;
    $P_{SB,init}$ = $P_{SB,stored}$(i, j−1);
    $P_{SB,init}$ += ($P_{SB,stored}$(i−1, j) − $P_{SB,stored}$(i, j−1) + 1<<(K−1)) ) >> K;
    // same formula for $N_{SB,init}$ with the factor K
Else
    K=−K;
    Si (K>16) then K=16;
    PSB,init = PSB,stored(i−1, j);
    PSB,init += (PSB,stored(i, j−1) − PSB,stored(i−1, j) + (1<<(K−1)) ) >> K;
    // same formula for $N_{SB,init}$ with the factor K
End
Typical values of the parameters for super-blocks sized 8×8 blocks (8×8 sized blocks) are: Tmin=−20, Tmax=14.

Although the present disclosure has been described with reference to one or more examples, workers skilled in the art will recognize that changes may be made in form and detail without departing from the scope of the disclosure and/or the appended claims.

The invention claimed is:

1. A method for encoding at least one image represented by a sequence of symbols generated according to a predetermined encoding scan order, wherein the method comprises the following steps:

determining sub-sequences in each sequence, a sub-sequence comprising a predetermined grouping of symbols; and scanning determined sub-sequences comprising the following sub steps for at least one current sub-sequence and for at least one context, wherein at least one step is performed by a processor device:

determining a neighboring group comprising a least two previously encoded sub-sequences, called a current encoded neighboring group, amongst which at least one belongs to an encoded neighboring group associated with a sub-sequence, distinct from said current sub-sequence, said distinct sub-sequence not belonging to said encoded neighboring group of the current sub-sequence, and said current sub-sequence not belonging to the encoded neighboring group of said distinct sub-sequence;

initializing at least one probability of appearance of a symbol associated with the context, called a current probability of appearance, taking account of at least two probabilities of appearance of said symbol, called known probabilities of appearance, relative to two previously encoded sub-sequences of said current encoded neighboring group;

successive entropy encoding of said symbols according to said predetermined encoding scan order and, for each symbol, updating of said current probability of appearance for the context associated with said symbol; and storing said current probability of appearance of said encoded symbols in the current sub-sequence in a computer-readable memory, after encoding of the last symbol of said current sub-sequence.

2. The method for encoding according to claim 1, wherein the sequence of symbols is obtained by blockwise encoding and the predetermined grouping of the symbols is a grouping of blocks of fixed size.

3. The method for encoding according to claim 2, wherein said current encoded neighboring group is situated in a rectangle demarcated on the one hand by the first encoded block of the image in the predetermined encoding scan order, and, on the other hand, by the grouping of blocks constituting the current sub-sequence.

4. The method for encoding according to claim 3, wherein said at least two groupings of blocks constituting said at least two previously encoded sub-sequences of said current encoded neighboring group are adjacent to the grouping of blocks constituting the current sub-sequence.

5. The method for encoding according to claim 1, wherein said step of initializing assigns said current probability of appearance a value equal to a combination of the known probabilities of appearance associated with at least two previously encoded sub-sequences of said current encoded neighboring group.

6. The method for encoding according to claim 5, wherein said combination takes account of the known probabilities of appearance associated with a first sub-sequence of said current encoded neighboring group situated to the left of said current sub-sequence and a second sub-sequence of said current encoded neighboring group situated above said current sub-sequence.

7. The method for encoding according to claim 1, wherein the method comprises a step of determining a measure of confidence assigned to said current probability of appearance after the encoding of the last symbol of said current sub-sequence.

8. The method for encoding according to claim 7, wherein said initialization step assigns said current probability of appearance a value equal to an average of the known probabilities of appearance associated with said sub-sequences of said current encoded neighboring group each weighted by a measure of confidence determined during said determining step.

9. The method for encoding according to claim 1, wherein the method comprises:

defining at least two classes of sub-sequences of symbols;

assigning a class, called a current class, to said current sub-sequence, this sub-sequence having, in its current encoded neighboring group, at least one previously encoded sub-sequence, denoted as a dependency sub-sequence, to which there is assigned a class distinct from said current class; and generating one sub-stream per class, each sub-stream bearing information representing the entropy encoding of the symbols of the sub-sequences belonging to said class.

10. A method for decoding a stream representing at least one encoded image, comprising the following steps:

obtaining at least one sub-sequence comprising a predetermined grouping of symbols; and for at least one sub-sequence thus obtained and for at least one context, wherein at least one step is performed by a processor device:

initializing at least one probability of appearance of a symbol associated with said context, called a current probability of appearance, taking account of at least two probabilities of appearance of said symbol, called known probabilities of appearance, pertaining to two previously decoded sub-sequences of a current decoded neighboring group, a decoded neighboring group comprising at least two previously decoded sub-sequences, amongst which at least one belongs to a decoded neighboring group associated with a sub-sequence distinct from said current sub-sequence;

successive entropy decoding of said symbols according to an encoding scan order implemented during an encoding of said image and, for each symbol, updating of said current probability of appearance for the context associated with said symbol;

storing said current probability of appearance of said decoded symbols in the current sub-sequence in a computer-readable memory, after decoding the last symbol of said current sub-sequence.

11. The method for decoding according to claim 10, wherein a class is assigned to at least one sub-sequence of symbols during said encoding, said stream is formed by at least two sub-streams each associated with one of said classes, each sub-stream carrying information representing the entropy encoding of the symbols of the sub-sequences belonging to said class, and said steps of initialization, decoding and storing for sub-sequences belonging to a same class are implemented sub-stream by sub-stream, said sub-streams being parallel-processed, said steps of initialization, decoding and storing for at least one sub-sequence of dependency having been preliminarily implemented.

12. A device for encoding at least one image represented by a sequence of symbols generated according to a predetermined encoding scan order, wherein the device comprises:

means for determining sub-sequences in each sequence, a sub-sequence comprising a predetermined grouping of symbols; and means for scanning determined sub-sequences comprising, for at least one current sub-sequence and for at least one context:

means for determining a neighboring group comprising a least two previously encoded sub-sequences, called a current encoded neighboring group, amongst which at least one belongs to an encoded neighboring group associated with a sub-sequence, distinct from said current sub-sequence, said distinct sub-sequence not belonging to said encoded neighboring group of the current sub-sequence, and said current sub-sequence not belonging to the encoded neighboring group of said distinct sub-sequence;

means for initializing at least one probability of appearance of a symbol associated with said context, called a current probability of appearance, taking account of at least two probabilities of appearance of said symbol, called known probabilities of appearance, relative to two previously encoded sub-sequences of said current encoded neighboring group;

means for successive entropy encoding of said symbols according to said predetermined encoding scan order, and for each symbol, means for updating said current probability of appearance for the context associated with said symbol; and means for storing said current probability of appearance of said encoded symbols in the current sub-sequence, after encoding of the last symbol of said current sub-sequence.

13. A device for decoding a stream representing at least one encoded image, wherein the device comprises:

means for obtaining at least one sub-sequence comprising a predetermined grouping of symbols; and means for performing, for at least one sub-sequence thus obtained and for at least one context:

initializing at least one probability of appearance of a symbol associated with said context, called a current probability of appearance, taking account of at least two probabilities of appearance of said symbol, called known probabilities of appearance, pertaining to two previously decoded sub-sequences of a current decoded neighboring group, a decoded neighboring group comprising at least two previously decoded sub-sequences, amongst which at least one belongs to a decoded neighboring group associated with a sub-sequence distinct from said current sub-sequence, said distinct sub-sequence not belonging to said encoded neighboring group of the current sub-sequence and said current sub-sequence not belonging to the encoded neighboring group of said distinct sub-sequence;

successive entropy decoding of said symbols according to an encoding scan order implemented during an encoding of said image and, for each symbol, means for updating of said current probability of appearance for the context associated with said symbol; and storing said current probability of appearance of said decoded symbols in the current sub-sequence, after decoding of the last symbol of said current sub-sequence.

14. A non-transitory computer-readable memory comprising instructions stored thereon to implement a method for encoding at least one image represented by a sequence of symbols generated according to a predetermined encoding scan order, when said instructions are executed by a processor, wherein the instructions comprise:

instructions for determining sub-sequences in each sequence, a sub-sequence comprising a predetermined grouping of symbols; and instructions for scanning determined sub-sequences comprising the following sub-steps for at least one current sub-sequence and for at least one context:

determining a neighboring group comprising a least two previously encoded sub-sequences, called a current encoded neighboring group, amongst which at least one belongs to an encoded neighboring group associated with a sub-sequence, distinct from said current sub-sequence, said distinct sub-sequence not belonging to said encoded neighboring group of the current sub-sequence, and said current sub-sequence not belonging to the encoded neighboring group of said distinct sub-sequence;

initializing at least one probability of appearance of a symbol associated with the context, called a current probability of appearance, taking account of at least two probabilities of appearance of said symbol, called known probabilities of appearance, relative to two previously encoded sub-sequences of said current encoded neighboring group;

successive entropy encoding of said symbols according to said predetermined encoding scan order and, for each symbol, updating of said current probability of appearance for the context associated with said symbol; and storing said current probability of appearance of said encoded symbols in the current sub-sequence, after encoding of the last symbol of said current sub-sequence.

15. A device for transcoding at least one image represented by a sequence of symbols generated according to a predetermined encoding scan order, wherein the device comprises:

means for entropy decoding of the encoded symbols of said sequence, capable of providing a sequence of decoded symbols; and an entropy encoding device according to claim 12, capable of encoding the symbols of said sequence of decoded symbols.

16. An encoder device comprising the non-transitory computer-readable memory of claim 14.

* * * * *